United States Patent
Zhang et al.

(10) Patent No.: US 11,322,566 B2
(45) Date of Patent: May 3, 2022

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shun Zhang, Beijing (CN); Tingliang Liu, Beijing (CN); Yonglin Guo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 78 days.

(21) Appl. No.: 16/757,852

(22) PCT Filed: Aug. 30, 2019

(86) PCT No.: PCT/CN2019/103688
§ 371 (c)(1),
(2) Date: Apr. 21, 2020

(87) PCT Pub. No.: WO2020/043190
PCT Pub. Date: Mar. 5, 2020

(65) Prior Publication Data
US 2021/0193745 A1 Jun. 24, 2021

(30) Foreign Application Priority Data
Aug. 31, 2018 (CN) .......................... 201811015241.8

(51) Int. Cl.
*H01L 27/32* (2006.01)
*G06F 1/16* (2006.01)

(52) U.S. Cl.
CPC .......... *H01L 27/326* (2013.01); *H01L 27/322* (2013.01); *G06F 1/163* (2013.01)

(58) Field of Classification Search
CPC .................................................... H01L 27/326
See application file for complete search history.

(56) References Cited

U.S. PATENT DOCUMENTS

2005/0225690 A1* 10/2005 Battersby ............ G02F 1/13336
349/41
2009/0267870 A1* 10/2009 Schellingerhout ..........................
G02F 1/133305
345/55

(Continued)

FOREIGN PATENT DOCUMENTS

| CN | 104465712 A | 3/2015 |
|----|-------------|--------|
| CN | 105911744 A | 8/2016 |

(Continued)

OTHER PUBLICATIONS

Chinese First Office Action dated Sep. 23, 2021 corresponding to application No. 201811015241.8.

*Primary Examiner* — Douglas M Menz
(74) *Attorney, Agent, or Firm* — Nath, Goldberg & Meyer; Joshua B. Goldberg

(57) ABSTRACT

The present disclosure provides a display substrate, including: a display area having a contour, at least a portion of the contour having a curved shape, the display area being divided into a plurality of sub-display areas, at least one of the sub-display areas close to an edge of the display area having a contour conformal to the contour of the display area. The at least one sub-display area includes a plurality of sub-pixels arranged therein along an extending direction of the contour of the sub-display area.

15 Claims, 2 Drawing Sheets

(56) References Cited

U.S. PATENT DOCUMENTS

| | | | |
|---|---|---|---|
| 2014/0002897 A1* | 1/2014 | Krijn | G02B 30/27 |
| | | | 359/463 |
| 2016/0113106 A1 | 4/2016 | Kim | |
| 2017/0352710 A1* | 12/2017 | Hong | H01L 27/3218 |
| 2018/0219051 A1* | 8/2018 | Ghosh | H01L 51/56 |
| 2019/0006443 A1* | 1/2019 | Hanashima | H01L 27/3246 |
| 2019/0096310 A1* | 3/2019 | Chen | G09G 3/2003 |

FOREIGN PATENT DOCUMENTS

| | | |
|---|---|---|
| CN | 107589600 A | 1/2018 |
| CN | 107742473 A | 2/2018 |
| CN | 108010952 A | 5/2018 |
| CN | 108369360 A | 8/2018 |

\* cited by examiner

DISPLAY SUBSTRATE AND DISPLAY DEVICE

CROSS-REFERENCE TO RELATED APPLICATION

This is a National Phase application filed under 35 U.S.C. 371 as a national stage of PCT/CN2019/103688, filed on Aug. 30, 2019, an application claiming priority to Chinese patent application No. 201811015241.8, filed on Aug. 31, 2018, the entire contents of each of which are incorporated herein by reference.

TECHNICAL FIELD

The present disclosure relates to the field of display technologies, in particular to a display substrate and a display apparatus.

BACKGROUND

Active Matrix Organic Light-Emitting Diodes (AMO-LEDs) have advantages such as self-luminescence, wide color gamut, high contrast, lightness and thinness, and thus are widely applied to the field of flexible wearable devices. Circular wearable devices (such as smartwatches) are becoming the mainstream modality due to their better user experience.

SUMMARY

Embodiments of the present disclosure provide a display substrate, including a display area having a contour, at least a portion of the contour having a curved shape, where the display area is divided into a plurality of sub-display areas, at least one sub-display area of the plurality of sub-display areas close to an edge of the display area having a contour conformal to the contour of the display area, and the at least one sub-display area includes a plurality of sub-pixels arranged therein along an extending direction of the contour of the sub-display area.

In some embodiments, the at least one sub-display area includes a plurality of annular sub-display areas arranged in a radial direction, and each of the plurality of annular sub-display areas includes a plurality of sub-pixels arranged therein along an extending direction of the contour of the sub-display area.

In some embodiments, the plurality of sub-pixels include a plurality of first sub-pixels, a plurality of second sub-pixels, and a plurality of third sub-pixels having different colors. A plurality of pixel units are sequentially arranged along the extending direction of the contour of each of the sub-display areas, and each pixel unit consists of one first sub-pixel, one second sub-pixel, and one third sub-pixel which are adjacently and continuously arranged in a corresponding one of the sub-display areas in which the pixel unit is located.

In some embodiments, the display substrate is an organic electroluminescent diode display substrate, and each of the first sub-pixels to the third sub-pixels includes an organic electroluminescent diode.

In some embodiments, the display substrate further includes pixel driving circuits arranged in an array on a base substrate on which the organic electroluminescent diodes are formed, and each of the pixel driving circuits is coupled to an anode of a corresponding one of the organic electroluminescent diodes.

In some embodiments, the first sub-pixels include red organic electroluminescent diodes, the second sub-pixels include green organic electroluminescent diodes, and the third sub-pixels include blue organic electroluminescent diodes.

In some embodiments, the display substrate further includes a pixel defining layer formed on a layer in which an anode of the organic electroluminescent diode is located; the pixel defining layer defines a first opening for accommodating a light emitting layer of the red organic electroluminescent diodes, a second opening for accommodating a light emitting layer of the green organic electroluminescent diodes, and a third opening for accommodating a light emitting layer of the blue organic electroluminescent diodes; the first opening has an area S1, the second opening has an area S2, and the third opening has an area S3, where S1<S2<S3.

In some embodiments, the display area has a circular shape, and the plurality of annular sub-display areas have a circular ring shape concentric with the display area, where the plurality of annular sub-display areas are symmetric about a first axis, the display area is symmetric about the first axis, and the plurality of pixel units are symmetric about the first axis.

In some embodiments, the display area has an ellipse shape, and the plurality of annular sub-display areas have an elliptical ring shape concentric with the display area, wherein the plurality of annular sub-display areas are symmetric about a first axis, the display area is symmetric about the first axis, and the plurality of pixel units are symmetric about the first axis.

In some embodiments, centers of the first opening, the second opening, and the third opening in a same one of the annular sub-display areas are located on a same circle, and centers of the first opening, the second opening, and the third opening in each of different ones of the sub-display areas are located on a different concentric circle.

In some embodiments, centers of the first opening, the second opening, and the third opening in a same one of the annular sub-display areas have the same distance to a circle center of the annular sub-display area, and centers of the first opening, the second opening, and the third opening in different ones of the sub-display areas have different distances to circle centers of respective ones of the different ones of the sub-display areas.

In some embodiments, the display substrate includes a color filter substrate, and the sub-pixels include color filters.

In some embodiments, the sub-pixels include: red filters, green filters, and blue filters.

In some embodiments, the display substrate includes an array substrate, and each of the first sub-pixels to third sub-pixels includes a pixel electrode.

In some embodiments, a distance between centers of any two directly-adjacent ones of the sub-pixels in each of the sub-display areas is the same.

In some embodiments, a distance between a center of each sub-pixel in one sub-display area of two adjacent ones of the sub-pixel areas and a center of a corresponding one sub-pixel in the other of the two adjacent ones of the sub-pixel areas and adjacent to the sub-pixel in the one sub-display area is the same.

In some embodiments, each of the plurality of sub-display areas has a contour conformal to the contour of the display area, and each of the sub-display areas includes a plurality of sub-pixels arranged therein along an extending direction of the contour of the sub-display area.

In some embodiments, the first sub-pixels, the second sub-pixels and the third sub-pixels in each of the plurality of annular sub-display areas are arranged in a same order along the extending direction of the contour of the sub-display area in which the first sub-pixels, the second sub-pixels and the third sub-pixels are located.

Embodiments of the present disclosure provide a display apparatus, including: the display substrate described in the embodiments of the present disclosure.

In some embodiments, the display apparatus includes: a watch or a wristband.

Embodiments of the present disclosure provide a display apparatus, including: the color filter substrate described in the embodiments of the disclosure and the array substrate described in the embodiments of the disclosure aligned with each other.

DETAILED DESCRIPTION

To improve understanding of the technical solution of the present disclosure for those skilled in the art, the present disclosure will now be described in detail with the help of accompanying drawings and specific embodiments.

Figure 1:
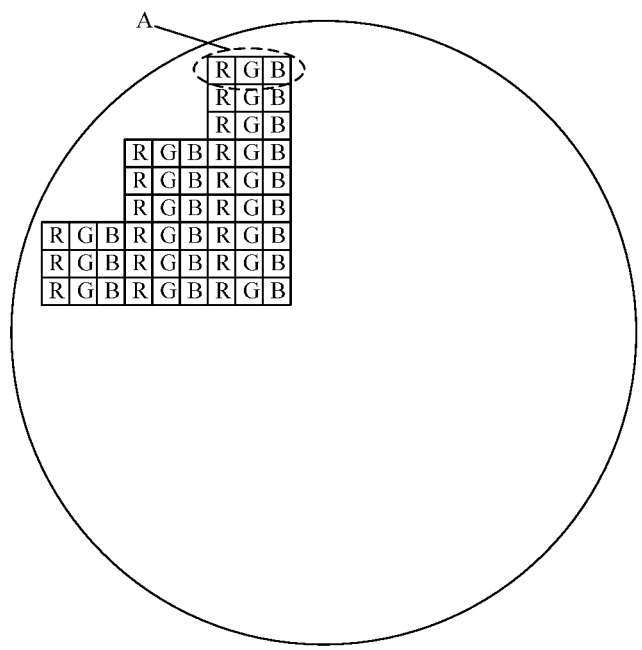
FIG. 1 is a schematic diagram of a pixel arrangement at an edge of an active area of a conventional circular AMOLED display device.

FIG. 1 is a schematic diagram illustrating a pixel arrangement at an edge of an active area (AA) of a conventional circular AMOLED display device. Taking each pixel unit A including three sub-pixels (R, G and B) as an example, active light emission is realized by evaporating R, G and B light emitting materials in openings of a pixel defining layer on an anode layer of each pixel unit A. As shown in FIG. 1, in the conventional circular AMOLED display device, each pixel unit has a rectangular shape of a certain size, and as a result, the arrangement of R, G, and B sub-pixels may exhibit saw-toothed steps at the edge of the display area. It should be noted that, in FIG. 1, only part (the pixel arrangement in the upper left corner of the circular region) of the pixel arrangement in the display device is schematically illustrated. When the display device is lighted, saw-toothed display which is visible to the naked eye appears at the edge, which seriously affects the display effect. Existing compensation algorithms may improve this phenomenon somewhat, but cannot completely eliminate the saw-toothed shape, and the compensation approach has some limitations (e.g., only corresponding to boundaries of a particular pattern).

Accordingly, in the embodiments of the present disclosure, a display substrate and a display apparatus are provided.

The display substrate provided in the embodiment(s) of the present disclosure includes a display area and a non-display area surrounding the display area, and the display area has a contour, at least a portion of which has a curved (e.g., arcuate) shape. The display area refers to an area for forming pixel units (e.g., pixels each composed of red, green, and blue sub-pixels). The contour shape of the non-display area (i.e., a contour of the display substrate) is not limited in this embodiment. In this embodiment, the non-display area may have a contour of the same shape as the display area, or may have a contour of a different shape from the display area. Throughout the specification, the term "contour" may refer to an outer edge or boundary of an area or element.

The display area in the embodiment may have a contour specifically in the shape of, for example, a rectangle with rounded corners, a sector, an ellipse, a circle, or the like. However, in the following embodiments, to facilitate understanding, a display substrate having a circular display area is taken as an example for description, but the embodiments of the present disclosure are not limited thereto.

Since the display apparatus has an increasing narrower frame, the display area of the display substrate is designed to have the same contour as the display substrate. Therefore, the following specific embodiments are all described by taking the display substrate having the same contour as the display area as an example, that is, both the display substrate and the display area have a circular contour, but the embodiments of the present disclosure are not limited thereto.

In an embodiment, there is provided a display substrate including a display area, where the display substrate and the display area have the same contour and both have a circular contour. The display area is divided into a plurality of sub-display areas, at least one of which close to an edge of the display area has a contour conformal to the contour of the display area.

Figure 2:
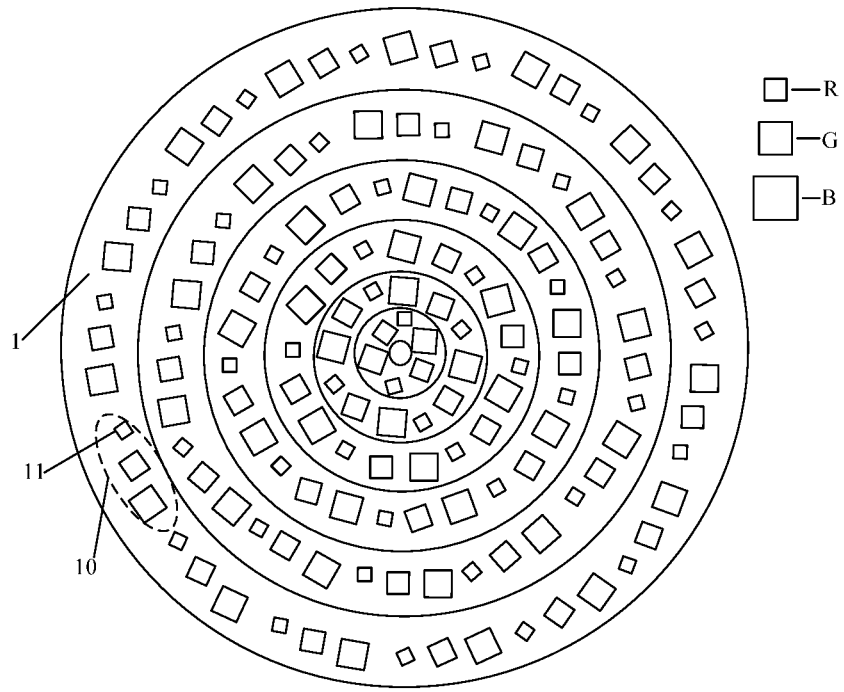
FIG. 2 is a schematic structural diagram of a display substrate according to an embodiment of the disclosure.

FIG. 2 illustrates an example of a display substrate according to an embodiment of the present disclosure. In this example, each of the sub-display areas has a contour conformal to the contour of the display area. Referring to FIG. 2, the display area includes a plurality of sub-display areas 1 each having a contour conformal to the contour of the display area, and the sub-display areas 1 are nested with each other. That is, the sub-display areas 1 are a plurality of annular sub-display areas arranged in a radial direction. Specifically, as shown in FIG. 2, the plurality of sub-display areas 1 are distributed in concentric rings, where the outermost sub-display area 1 has an outer diameter equal to a diameter of the display area, and for the sub-display areas 1 sequentially arranged from the outermost ring to the innermost ring along the diameter direction, a first sub-display area 1 has an inner diameter equal to an outer diameter of a second sub-display area 1 adjacent to the first sub-display at the inner side thereof, and the innermost sub-display area 1 has a circular shape. Each of the sub-display areas 1 is provided with a plurality of pixel units 10 sequentially arranged along an extending direction of the contour of the sub-display area. It should be noted that, in FIG. 2, only a general arrangement rule of the pixel units 10 is illustratively shown.

It will be appreciated that in an embodiment of the present disclosure, the display area has a circular contour, and the corresponding sub-display area 1 having a contour conformal to the contour of the display area has a circular ring shape. In other embodiments of the present disclosure, the display area has an ellipse contour, and the corresponding sub-display area 1 having a contour conformal to the contour of the display area has an elliptical ring shape. In other embodiments of the present disclosure, the display area may have a contour, at least a portion of which has a curved shape, and accordingly, the sub-display area 1 has a shape at least a portion of which has the same curved shape.

In FIG. 2, a display substrate according to an embodiment of the present disclosure is illustrated by taking each of the sub-display areas having a contour conformal to the contour of the display area as an example. However, the present disclosure is not limited thereto, as long as at least one sub-display area 1 at an edge of the display area of the display substrate has a contour conformal to that of the display area.

In an embodiment of the present disclosure, the at least one sub-display area includes a plurality of annular sub-display areas arranged in a radial direction, and each of the plurality of annular sub-display areas includes a plurality of pixel units arranged therein along an extending direction of the contour of the sub-display area.

In an embodiment of the present disclosure, the display area has a circular shape, and the plurality of annular sub-display areas have a circular ring shape concentric with the display area. In the display substrate of the embodiment, the sub-display area 1 has a shape conformal to the contour of the display area, i.e., the display area has a circular shape and the sub-display area has a circular ring shape, and the pixel units 10 in each of the sub-display areas 1 are sequentially arranged along an extending direction of a contour of the sub-display area 1. That is, the pixel units 10 in each of the sub-display areas 1 are arranged on a base substrate of the display substrate circle by circle, so that no pixel unit 10 will be arranged in a saw-toothed manner at the edge of the arcuate display substrate, and thus, the display apparatus using the display substrate of the embodiment has a better display effect.

In the circular display substrate of the embodiment, the respective sub-display areas 1 are concentrically arranged. The pixel units 10 in each of the sub-display areas 1 are sequentially arranged along an extending direction of the contour of the sub-display area, that is, the display substrate in the embodiment includes multiple circles of concentrically arranged pixel units 10. In this way, more pixel units 10 can be provided in a unit area of the display area, thereby achieving high-resolution design of the display apparatus.

In an embodiment of the present disclosure, each sub-display area may have the same number of rows of sub-pixels, for example, each has one row of sub-pixels, or each has n rows of sub-pixels, where n is greater than or equal to 1 and less than or equal to 5, and the innermost sub-display area may be different from other sub-display areas because of the concentrated sub-pixels, for example, the innermost sub-display area may have more rows of sub-pixels than other sub-display areas. Each sub-display area may be taken as an integral unit to be driven to arrange a pixel circuit, and different sub-display areas may have similar overall pixel arrangement. For example, the same signal line is located at the same position in each sub-display area, and so on.

It should be noted that, the display substrate in the embodiment is not limited to the aforementioned circular display substrate, and the sub-display area 1 is not limited to the annular shape; the display substrate may have an ellipse shape, the sub-display area 1 has an elliptical ring shape, and the elliptical rings have the same center to achieve uniform display. In an embodiment of the present disclosure, the display area has a circular shape, and the plurality of annular sub-display areas each have a circular ring shape concentric with the display area, where the plurality of annular sub-display areas are symmetric about one axis of symmetry, the display area is symmetric about the axis of symmetry, and the plurality of pixel units are symmetric about the axis of symmetry. In another embodiment of the present disclosure, the display area has an ellipse shape, and the plurality of annular sub-display areas each have an elliptical ring shape concentric with the display area, where the plurality of annular sub-display areas are symmetric about one axis of symmetry, the display area is symmetric about the axis of symmetry, and the plurality of pixel units are symmetric about the axis of symmetry.

In an embodiment of the present disclosure, each of the pixel units consists of one first sub-pixel, one second sub-pixel, and one third sub-pixel having different colors, where the first sub-pixel, the second sub-pixel and the third sub-pixel are sequentially arranged along the extending direction of the contour of the sub-display area in which the sub-pixels are located. Specifically, each of the pixel units 10 may include display structures 11 having different colors and sequentially arranged along the extending direction of the contour of the sub-display area 1 in which the pixel unit is located. For example, each of the pixel units 10 includes a display structure R emitting red light, a display structure G emitting green light, and a display structure B emitting blue light, where the display structures R, G and B are sequentially arranged along the extending direction of the contour of the sub-display area in which the display structures are located. In other embodiments of the present disclosure, the first sub-pixel, the second sub-pixel and the third sub-pixel in each of the plurality of annular sub-display areas are arranged in the same order along the extending direction of the contour of the sub-display area in which the sub-pixels are located. It should be noted that, the colors of light emitted from the display structures 11 in each pixel unit 10 are not limited to the three colors of red, green and blue.

It will be appreciated that each of the sub-display areas 1 has the same number of display structures of the three colors of red, green and blue arranged therein, and therefore, there is no incomplete pixel unit in any of the sub-display areas 1, thereby achieving a better display effect of the display substrate. In an embodiment of the present disclosure, the display structure 11 may also be referred to as the sub-pixel 11.

In an embodiment of the present disclosure, in two adjacent sub-display areas, distances between a center of each display structure in one sub-display area and centers of display structures in the other adjacent sub-display area adjacent to the display structure in the one sub-display area are the same. Specifically, in an embodiment of the present disclosure, a distance between any two adjacent annular sub-display areas 1 is the same, and a distance between centers of any two directly adjacent display structures on each sub-display area 1 is the same. In this way, since the display substrate is a circular display substrate, the sub-display area 1 is an annular display area, and distances between adjacent display structures are the same, so that the display structures 11 of the display substrate are uniformly arranged, and the display apparatus using the display substrate has a uniform display effect.

Figure 3:
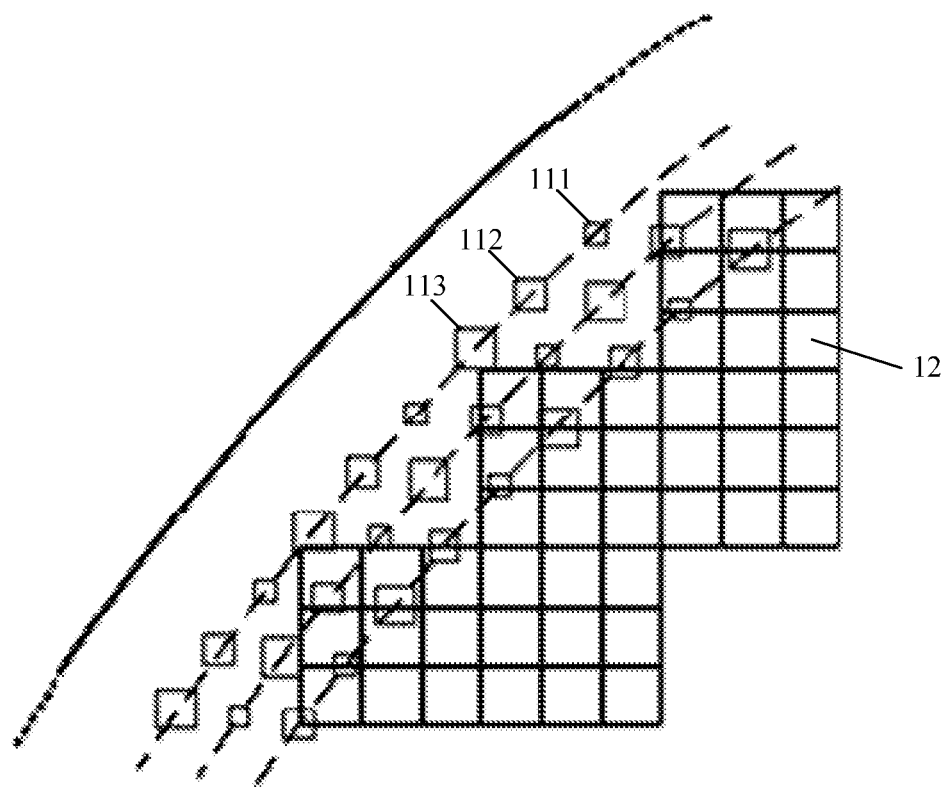
FIG. 3 is a schematic structural diagram of an edge of a display substrate according to an embodiment of the disclosure.

FIG. 3 is a schematic structural diagram of an edge of a display substrate according to an embodiment of the disclosure. It is to be noted that the same elements in FIG. 3 as those in FIG. 2 are referred by the same reference numerals as in FIG. 2, and are not specifically shown in the figure for the sake of simplicity; also, FIG. 3 merely schematically illustrates a partial structure of the display substrate. Referring to FIG. 3, this embodiment provides a display substrate including a display area; an edge of the display area has a contour in a curved shape (in an arcuate shape in FIG. 3), where the display area is divided into a plurality of sub-display areas 1, at least one of the sub-display areas 1 close to an edge of the display area has a contour conformal to the contour of the display area, i.e., at least one sub-display area close to the edge of the display area also has an arcuate shape. The at least one sub-display area includes a plurality of pixel units 10 arranged therein along an extending direction of the contour of the sub-display area.

In an embodiment of the present disclosure, the at least one sub-display area includes a plurality of annular sub-display areas arranged in a radial direction away from the edge of the display area, and each of the plurality of annular sub-display areas includes a plurality of pixel units arranged therein along an extending direction of the contour of the sub-display area.

It will be appreciated that, in an embodiment of the present disclosure, the display area has an arcuate contour, and the sub-display area 1 conformal to the contour of the display area and close to the edge of the display area has an arcuate shape. In an embodiment of the present disclosure, the shape of the sub-display area 1 that is not close to the edge of the display area is not limited. In an embodiment of the present disclosure, the pixel units 10 in the sub-display area 1 that is not close to the edge of the display area may be arranged in an array.

In the display substrate of the embodiment, the sub-display area 1 close to the edge of the display area has a shape conformal to the contour of the display area, and the pixel units 10 in each of the sub-display areas 1 close to the edge of the display area are sequentially arranged along an extending direction of a contour of the sub-display area 1, i.e., the pixel units 10 in each of the sub-display areas 1 close to the edge of the display area are arranged on a base substrate of the display substrate circle by circle, so that no pixel unit 10 will be arranged in a saw-toothed manner at the edge of the arcuate display substrate, and thus, the display apparatus using the display substrate of the embodiment has a better display effect.

In the display substrate of the embodiment, the respective sub-display areas 1 close to the edge of the display area in the arcuate display substrate are concentrically arranged. The pixel units 10 in each of the sub-display areas 1 are sequentially arranged along an extending direction of the contour of the sub-display area, that is, the display substrate in the embodiment includes multiple circles of concentrically arranged pixel units 10 close to the edge of the display area. In this way, more pixel units 10 can be provided in a unit area of the display area, thereby achieving high-resolution design of the display apparatus.

It should be noted that, the display substrate in the embodiment is not limited to the aforementioned arcuate display substrate, and the sub-display area 1 is not limited to the arcuate shape. In an embodiment of the present disclosure, each of the pixel units consists of one first sub-pixel, one second sub-pixel, and one third sub-pixel having different colors, where the first sub-pixel, the second sub-pixel and the third sub-pixel in each of the plurality of annular sub-display areas are sequentially arranged along the extending direction of the contour of the sub-display area in which the sub-pixels are located. Specifically, in each of the sub-display areas 1 close to the edge of the display area, each of the pixel units 10 may include display structures 11 of different colors sequentially arranged along the extending direction of the contour of the sub-display area 1 in which the pixel unit is located. For example, each of the pixel units 10 includes a display structure R emitting red light, a display structure G emitting green light, and a display structure B emitting blue light, where the display structures R, G and B are sequentially arranged along the extending direction of the contour of the sub-display area in which the display structures are located. In other embodiments of the present disclosure, in each of different sub-display areas, the first sub-pixel, the second sub-pixel and the third sub-pixel are arranged in the same order along the extending direction of contour of the sub-display area in which the sub-pixels are located. It should be noted that, the colors of light emitted from the display structures 11 in each pixel unit 10 are not limited to three colors of red, green and blue.

It will be appreciated that each of the sub-display areas 1 has the same number of display structures of the three colors of red, green and blue arranged therein, and therefore, there is no incomplete pixel unit in any of the sub-display areas 1, thereby achieving a better display effect of the display substrate.

As shown in FIG. 3, as a first structure in the embodiment, the display substrate is an organic electroluminescent diode display substrate, and each of the pixel units 10 may include a red organic electroluminescent diode, a green organic electroluminescent diode, and a blue organic electroluminescent diode sequentially arranged. The organic electroluminescent diode substrate generally includes a base substrate. Pixel driving circuits 12 are formed on the base substrate, and the pixel driving circuits 12 are generally configured with switching transistors and driving transistors, storage capacitors, and the like. Further, an interlayer insulating layer is further disposed on the pixel driving circuits 12, via holes are formed by etching in the interlayer insulating layer, respective anodes of the organic electroluminescent diodes are formed on the interlayer insulating layer, and in this case each of the anodes is coupled to a drain electrode of a driving transistor in the corresponding pixel driving circuit 12 through a corresponding via hole. Further, a pixel defining layer is formed on the layer of the anodes, and the pixel defining layer defines therein a first opening 111 for accommodating a light emitting layer of the red organic electroluminescent diode, a second opening 112 for accommodating a light emitting layer of the green organic electroluminescent diode, and a third opening 113 for accommodating a light emitting layer of the blue organic electroluminescent diode; a red light emitting material is formed in the first opening 111, a green light emitting material is formed the second opening 112, and a blue light emitting material is formed the third opening 113; and cathodes of the organic electroluminescent diodes are formed on the layer where the red light emitting material, the green light emitting material and the blue light emitting material are located.

In an embodiment of the present disclosure, in two adjacent sub-display areas, a distances between a center of each display structure in one sub-display area and centers of display structures in the other adjacent sub-display area adjacent to the display structure in the one sub-display area are the same. Specifically, in an embodiment of the present disclosure, a distance between any two adjacent annular sub-display areas 1 is the same, and a distance between centers of any two directly adjacent organic electroluminescent diodes on each sub-display area 1 is the same. In this way, the display area has a contour, at least a portion of which has an arcuate shape, the sub-display area 1 close to the edge of the display area has an arcuate contour conformal to that of the sub-display area, and distances between adjacent organic electroluminescent diodes are the same, so that the display structures 11 of the display substrate are uniformly arranged, and the display apparatus using the display substrate has a uniform display effect.

In this embodiment, the pixel driving circuits 12 are arranged in an array for convenient preparation, and in this case, the anode of each organic electroluminescent diode needs to be lengthened a little to ensure stable connection between the anode and the corresponding pixel driving circuit 12.

Since the red, green and blue light emitting materials have different light emitting efficiencies, and specifically, among the three materials, the red light emitting material has the highest light emitting efficiency, the green light emitting material has a middle light emitting efficiency, and the blue light emitting material has the lowest light emitting efficiency. Accordingly, in order to ensure uniform display of the display panel using the display substrate according to the embodiment, in the pixel defining layer of the display substrate according to the embodiment, the first opening 111 for accommodating the light emitting layer of the red organic electroluminescent diode, the second opening 112 for accommodating the light emitting layer of the green organic electroluminescent diode, and the third opening 113 for accommodating the light emitting layer of the blue organic electroluminescent diode have areas of S1, S2 and S3, respectively, where S1<S2<S3. By adjusting the areas of the first opening 111, the second opening 112, and the third opening 113, the luminous brightnesses of organic electroluminescent diodes with different colors of red, green and blue are balanced so that the display uniformity of the display panel is improved.

In the display substrate of the embodiment, centers of the first opening 111, the second opening 112, and the third opening 113 in the same sub-display area 1 close to the edge of the display area are located on the same arc, and centers of the first opening 111, the second opening 112, and the third opening 113 in a different sub-display area 1 close to the edge of the display area are located on a different concentric arc. In other embodiments, centers of the first, second, and third openings in the same annular sub-display area close to the edge of the display area have the same distance to a circle center of the annular sub-display area, and centers of the first, second, and third openings in different sub-display areas close to the edge of the display area have different distances to circle centers of the corresponding annular sub-display areas. Therefore, it is ensured that the organic electroluminescent diodes in the display substrate are uniformly arranged so that the display panel using the display substrate according to the embodiment has uniform display.

It should be noted that in order to achieve the uniform display effect of the display panel, other methods may be adopted to optimize arrangement of the organic electroluminescent diodes on the display substrate so that the organic electroluminescent diodes on a connecting line from the center of each organic electroluminescent diode in the display structures along the outermost circle (a circle farthest from the center of the display substrate) of the display substrate to the center of the display substrate have the same color.

As a second structure in the embodiment, the display substrate is a color filter substrate used in a liquid crystal panel. In this case, the display structures 11 of different colors in the display substrate include red filters, green filters, and blue filters. Further, in this embodiment, the display substrate further includes an array substrate, and each display structure includes a pixel electrode.

In an embodiment of the present disclosure, in two adjacent sub-display areas, distances between a center of each display structure in one sub-display area and centers of display structures in the other adjacent sub-display area adjacent to the display structure in the one sub-display area are the same. Specifically, in an embodiment of the present disclosure, for the color filter substrate, a distance between any two adjacent annular sub-display areas 1 is the same, and a distance between centers of any two directly adjacent color filters on each sub-display area 1 is also the same so that the display structures 11 of the display substrate are uniformly arranged, and the display apparatus using the display substrate has a uniform display effect.

It should be noted that in order to achieve the uniform display effect of the display panel, other methods may be adopted to optimize arrangement of the color filters on the color filter substrate so that the color filters on a connecting line from the center of each color filter in the display structures along the outermost circle (a circle farthest from the center of the display substrate) of the display substrate to the center of the display substrate have the same color.

In an embodiment, there is provided a display apparatus including the display substrates described in the embodiments of the present disclosure.

The display apparatus may be a liquid crystal display apparatus or an electroluminescent display apparatus, such as a liquid crystal panel, an electronic paper, a mobile phone, a tablet, a television, a monitor, a laptop, a digital album, a navigator or any other product or component having a display function.

The display apparatus in the embodiment is particularly suitable for use in a watch since the dial of a watch typically has an arcuate shape; similarly, the present disclosure is also suitable for a display device having a structure similar to a watch, such as a wristband or the like.

In an embodiment, there is further provided a display apparatus including the color filter substrate and array substrate described in the embodiments of the present disclosure, where the color filter substrate is aligned with the array substrate.

In the display substrate of the disclosure, since the pixel units in each of the sub-display areas close to the edge of the display area are sequentially arranged along a circumferential direction of the sub-display area, i.e., arranged on a base substrate of the display substrate circle by circle, no pixel unit will be arranged in a saw-toothed manner at the edge position of the display substrate, and thus, the display apparatus using the display substrate of the disclosure has a better display effect.

It will be appreciated that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A display substrate, comprising a display area having a contour, at least a portion of the contour having a curved shape, wherein the display area is divided into a plurality of sub-display areas, at least one of the sub-display areas close to an edge of the display area having a contour conformal to the contour of the display area,
    wherein the at least one sub-display area comprises a plurality of sub-pixels arranged therein along an extending direction of the contour of the sub-display area,
    wherein the at least one sub-display area comprises a plurality of annular sub-display areas arranged in a radial direction, and each of the plurality of annular sub-display areas comprises a plurality of sub-pixels arranged therein along an extending direction of the contour of the sub-display area, wherein the plurality of sub-pixels comprise a plurality of first sub-pixels, a plurality of second sub-pixels, and a plurality of third sub-pixels having different colors, wherein a plurality of pixel units are sequentially arranged along the extending direction of the contour of each of the sub-display areas, and each pixel unit consists of one first sub-pixel, one second sub-pixel, and one third sub-pixel which are adjacently and continuously arranged in a corresponding one of the sub-display areas in which the pixel unit is located, wherein the display substrate is an organic electroluminescent diode display substrate, and the first sub-pixels comprise red organic electroluminescent diodes, the second sub-pixels comprise green organic electroluminescent diodes, and the third sub-pixels comprise blue organic electroluminescent diodes, and wherein the display substrate further comprises a pixel defining layer formed over a layer in which an anode of the organic electroluminescent diode is located, the pixel defining layer defines a first opening for accommodating a light emitting layer of the red organic electroluminescent diodes, a second opening for accommodating a light emitting layer of the green organic electroluminescent diodes, and a third opening for accommodating a light emitting layer of the blue organic electroluminescent diodes, and the first opening has an area S1, the second opening has an area S2, the third opening has an area S3<S2<S3.

2. The display substrate according to claim 1, further comprising pixel driving circuits arranged in an array on a base substrate on which the organic electroluminescent diodes are formed, wherein each of the pixel driving circuits is coupled to an anode of a corresponding one of the organic electroluminescent diodes.

3. The display substrate according to claim 1, wherein the display area has a circular shape, and the plurality of annular sub-display areas have a circular ring shape concentric with the display area, wherein the plurality of annular sub-display areas are symmetric about a first axis, the display area is symmetric about the first axis, and the plurality of pixel units are symmetric about the first axis.

4. The display substrate according to claim 1, wherein the display area has an ellipse shape, and the plurality of annular sub-display areas have an elliptical ring shape concentric with the display area, wherein the plurality of annular sub-display areas are symmetric about a first axis, the display area is symmetric about the first axis, and the plurality of pixel units are symmetric about the first axis.

5. The display substrate according to claim 3, wherein centers of the first opening, the second opening, and the third opening in a same one of the annular sub-display areas are located on a same circle, and centers of the first opening, the second opening, and the third opening in each of different ones of the sub-display areas are located on a different concentric circle.

6. The display substrate according to claim 3, wherein centers of the first opening, the second opening, and third opening in a same one of the annular sub-display areas have a same distance to a circle center of the annular sub-display area, and centers of the first opening, the second opening, and the third opening in different ones of the sub-display areas have different distances to circle centers of respective ones of the different ones of the sub-display areas.

7. The display substrate according to claim 1, wherein the display substrate comprises a color filter substrate, and wherein the sub-pixels comprise: color filters.

8. The display substrate according to claim 7, wherein the sub-pixels comprise: red filters, green filters, and blue filters.

9. The display substrate according to claim 1, wherein the display substrate comprises an array substrate, and each of the first sub-pixels to the third sub-pixels comprises a pixel electrode.

10. The display substrate according to claim 1, wherein a distance between centers of any two directly-adjacent ones of the sub-pixels in each of the sub-display areas is same.

11. The display substrate according to claim 1, wherein a distance between a center of each sub-pixel in one sub-display area of two adjacent ones of the sub-pixel areas and a center of a corresponding one sub-pixel in the other of the two adjacent ones of the sub-pixel areas and adjacent to the sub-pixel in the one sub-display area is same.

12. The display substrate according to claim 1, wherein each of the plurality of sub-display areas has a contour conformal to the contour of the display area, and
wherein each of the sub-display areas comprises a plurality of sub-pixels arranged therein along an extending direction of the contour of the sub-display area.

13. The display substrate according to claim 1, wherein the first sub-pixels, the second sub-pixels and the third sub-pixels in each of the plurality of annular sub-display areas are arranged in a same order along the extending direction of the contour of the sub-display area in which the first sub-pixels, the second sub-pixels and the third sub-pixels are located.

14. A display apparatus, comprising: the display substrate according claim 1.

15. A display apparatus, comprising: the display substrate according to claim 7 and a first display substrate aligned with each other,
wherein the first display substrate comprising a first display area having a first contour, at least a portion of the first contour having a curved shape, wherein the first display area is divided into a plurality of first sub-display areas, at least one of the first sub-display areas close to an edge of the first display area having a contour conformal to the first contour of the first display area,
wherein the at least one first sub-display area comprises a plurality of sub-pixels arranged therein along an extending direction of the contour of the first sub-display area,
the plurality of sub-pixels of the at least one first sub-display area comprise a plurality of first sub-pixels, a plurality of second sub-pixels, and a plurality of third sub-pixels having different colors, wherein a plurality of first pixel units are sequentially arranged along the extending direction of the contour of each of the first sub-display areas, and each first pixel unit consists of one first sub-pixel, one second sub-pixel, and one third sub-pixel which are adjacently and continuously arranged in a corresponding one of the first sub-display areas in which the first pixel unit is located, and
the first display substrate comprises an array substrate, and each of the first sub-pixels to the third sub-pixels of the at least one first sub-display area comprises a pixel electrode.

* * * * *